United States Patent
Debari et al.

(10) Patent No.: US 12,381,090 B2
(45) Date of Patent: Aug. 5, 2025

(54) ETCHING METHOD AND ETCHING APPARATUS

(71) Applicant: Tokyo Electron Limited, Tokyo (JP)

(72) Inventors: Toshinori Debari, Nirasaki (JP); Reiko Sasahara, Nirasaki (JP); Teppei Okumura, Nirasaki (JP); Woonghyun Jeung, Nirasaki (JP); Kenshiro Asahi, Nirasaki (JP); Hiroyuki Abe, Nirasaki (JP); Seungmin Kim, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 272 days.

(21) Appl. No.: 18/247,669

(22) PCT Filed: Oct. 28, 2021

(86) PCT No.: PCT/JP2021/039777
§ 371 (c)(1),
(2) Date: Apr. 3, 2023

(87) PCT Pub. No.: WO2022/102421
PCT Pub. Date: May 19, 2022

(65) Prior Publication Data
US 2024/0006187 A1    Jan. 4, 2024

(30) Foreign Application Priority Data

Nov. 11, 2020   (JP) ................................. 2020-188278

(51) Int. Cl.
*H01L 21/311*    (2006.01)
*H01L 21/02*     (2006.01)
*H01L 21/67*     (2006.01)

(52) U.S. Cl.
CPC .... *H01L 21/31116* (2013.01); *H01L 21/0206* (2013.01); *H01L 21/67069* (2013.01)

(58) Field of Classification Search
None
See application file for complete search history.

(56) References Cited

U.S. PATENT DOCUMENTS

| 2015/0187593 A1* | 7/2015 | Narushima | H01L 21/6708 |
| | | | 438/735 |
| 2020/0111674 A1* | 4/2020 | Sasahara | H01L 21/6708 |

FOREIGN PATENT DOCUMENTS

| JP | 2005-039185 A | 2/2005 |
| JP | 2008-160000 A | 7/2008 |
| JP | 2018-207088 A | 12/2018 |
| KR | 10-2015-0035583 A | 4/2015 |

\* cited by examiner

*Primary Examiner* — Roberts P Culbert
(74) *Attorney, Agent, or Firm* — Armstrong Teasdale LLP

(57) ABSTRACT

An etching method includes: providing, to an interior of a chamber, a substrate having a three-layered film formed by stacking a first silicon oxide-based film, a silicon nitride-based film, and a second silicon oxide-based film; and collectively etching the three-layered film using a $HF—NH_3$-based gas in the interior of the chamber while adjusting a gas ratio in each of the first silicon oxide-based film, the silicon nitride-based film, and the second silicon oxide-based film.

20 Claims, 6 Drawing Sheets

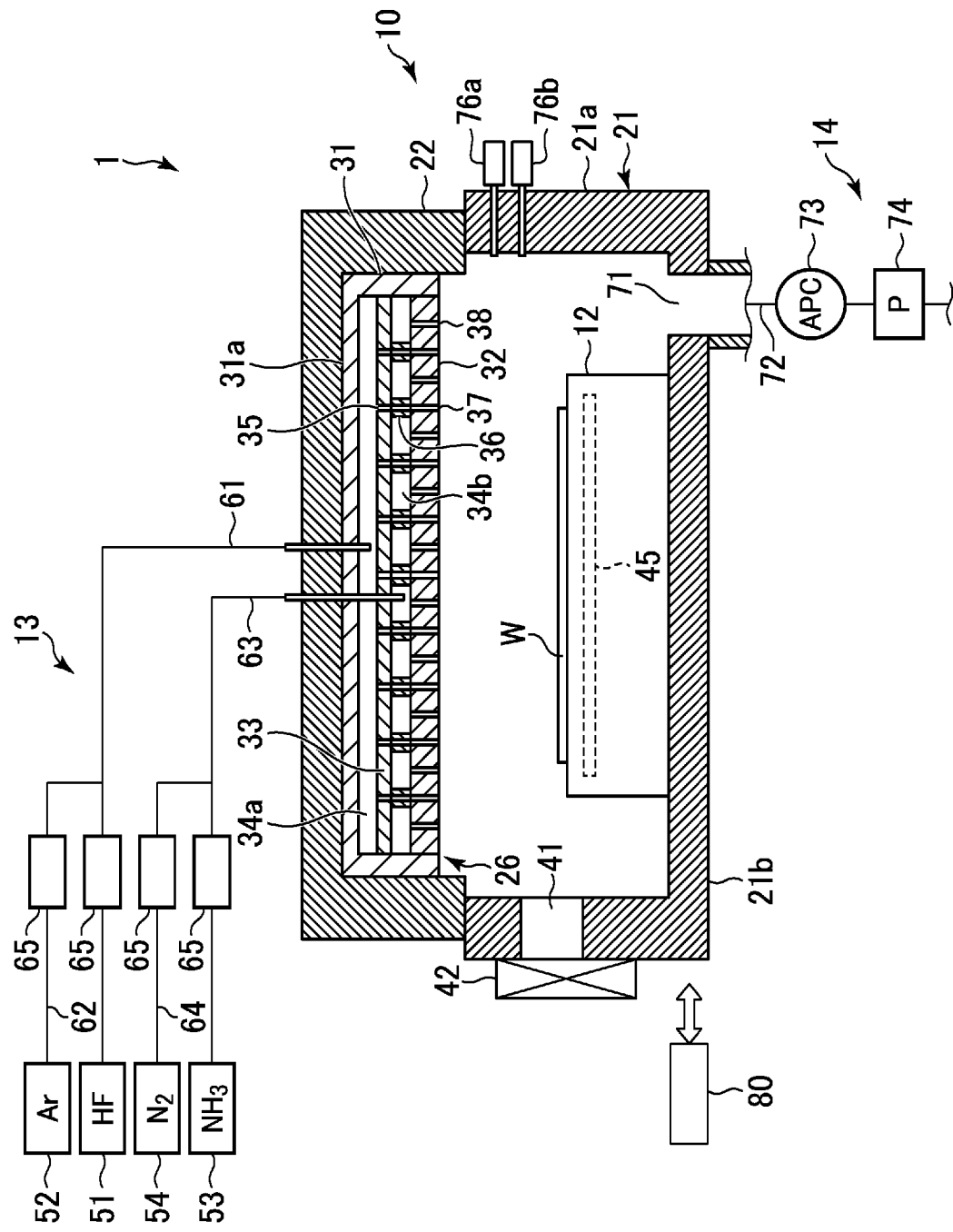

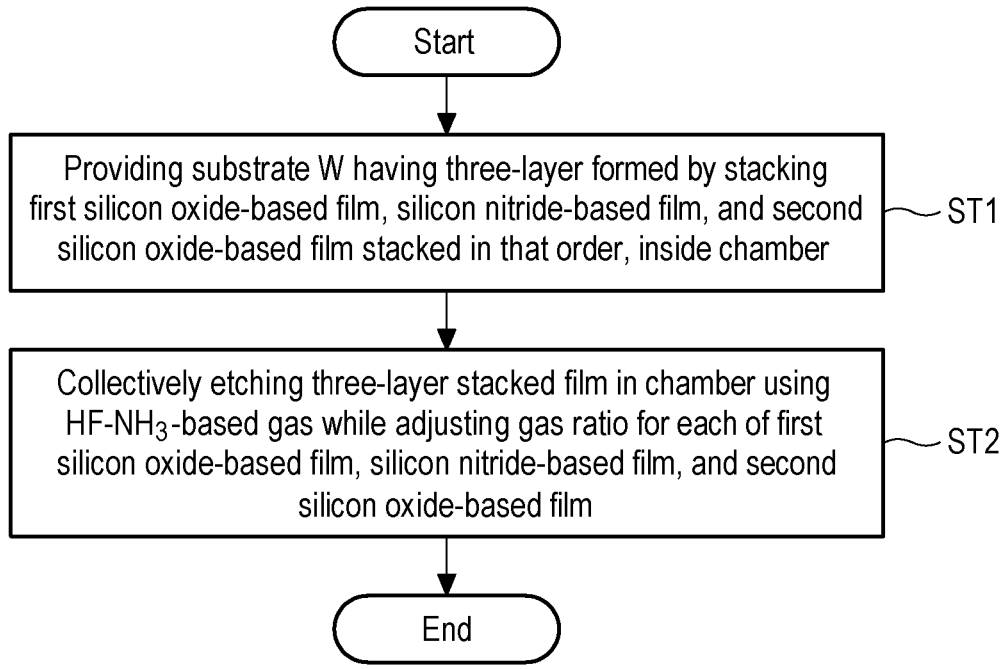
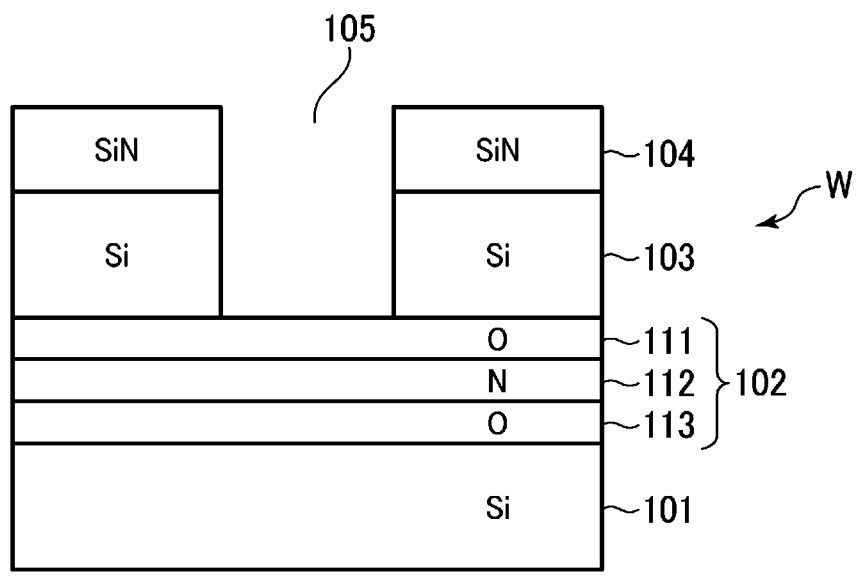

ETCHING METHOD AND ETCHING APPARATUS

CROSS-REFERENCE TO RELATED APPLICATIONS

The present application is a U.S. National Stage Entry of International Patent Application No. PCT/JP2021/039777, filed Oct. 28, 2021, which claims the benefit of priority to Japanese Patent Application No. 2020-188278, filed Nov. 11, 2020, each of which is hereby incorporated herein by reference in its entirety.

TECHNICAL FIELD

The present disclosure relates to an etching method and an etching apparatus.

BACKGROUND

In recent years, a method called chemical oxide removal (COR), in which chemical etching is performed without generating plasma inside a chamber in a process of manufacturing semiconductor devices, is known. As COR, a technique in which a hydrogen fluoride (HF) gas, which is a fluorine-containing gas, and an ammonia ($NH_3$) gas, which is a basic gas, are used for a silicon oxide film ($SiO_2$ film) present on the surface of a semiconductor wafer, which is a substrate, is known (for example, Patent Documents 1 and 2). In this technique, the HF gas and the $NH_3$ gas react with the silicon oxide film to generate ammonium fluorosilicate (($NH_4)_2SiF_6$; AFS), and the silicon oxide film is etched by sublimating the ammonium fluorosilicate by heating.

PRIOR ART DOCUMENTS

Patent Documents

Patent Document 1: Japanese Laid-Open Publication No. 2005-039185
Patent Document 2: Japanese Laid-Open Publication No. 2008-160000

The present disclosure provides some embodiments of an etching method and an etching apparatus capable of collectively removing a three-layered film composed of a first silicon oxide-based film, a silicon nitride-based film, and a second silicon oxide-based film.

SUMMARY

An etching method according to an aspect of the present disclosure includes: loading, into a chamber, a substrate having a three-layered film formed by stacking a first silicon oxide-based film, a silicon nitride-based film, and a second silicon oxide-based film; and collectively etching the three-layered film using a HF—$NH_3$-based gas inside the chamber while adjusting a gas ratio in each of the first silicon oxide-based film, the silicon nitride-based film, and the second silicon oxide-based film.

According to the present disclosure, it is possible to provide an etching method and an etching apparatus capable of collectively removing a three-layered film composed of a first silicon oxide-based film, a silicon nitride-based film, and a second silicon oxide-based film.

BRIEF DESCRIPTION OF DRAWINGS

FIG. 1 is a cross-sectional view showing an example of an etching apparatus used for carrying out an etching method according to an embodiment.

FIG. 2 is a flowchart for explaining the etching method according to the embodiment.

FIG. 3 is a cross-sectional view schematically showing a structural example of a substrate to which the etching method according to the embodiment is applied.

DETAILED DESCRIPTION

Figure 4:
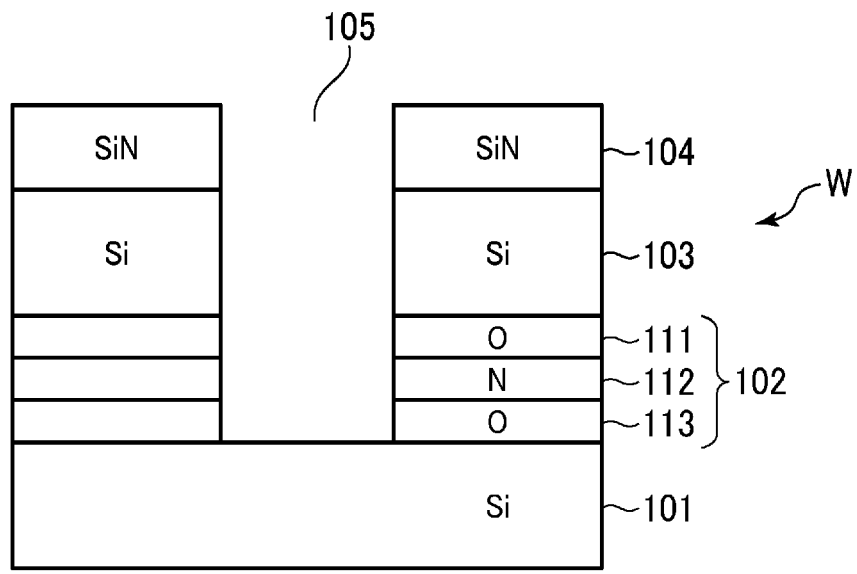
FIG. 4 is a cross-sectional view schematically showing a state in which an ONO stacked film is etched in the substrate of FIG. 3.

Embodiments will now be described with reference to the drawings.

<Etching Apparatus>

FIG. 1 is a cross-sectional view showing an example of an etching apparatus used for carrying out an etching method of an embodiment.

As shown in FIG. 1, an etching apparatus 1 includes a chamber 10 having a hermetically sealed structure. A stage 12 on which a substrate W is placed in a substantially horizontal posture is provided inside the chamber 10.

The etching apparatus 1 also includes a gas supply mechanism 13 used as a gas supplier that supplies a processing gas into the chamber 10, and an exhaust mechanism 14 used as an exhauster that exhausts the interior of the chamber 10.

The chamber 10 is constituted with a chamber main body 21 and a lid portion 22. The chamber main body 21 includes a substantially cylindrical sidewall portion 21a and a bottom portion 21b. An upper portion of the chamber main body 21 is opened as an opening. The opening is closed by the lid portion 22 having a concave portion formed therein. The sidewall portion 21a and the lid portion 22 are hermetically sealed by a sealing member (not shown) to secure airtightness with respect to the chamber 10.

A shower head 26 as a gas introduction member is fitted into the lid portion 22 so as to face the stage 12. The shower head 26 includes a cylindrical main body 31 and a shower plate 32 provided at the bottom of the main body 31. An intermediate plate 33 is provided in parallel with the shower plate 32 in a space formed by the main body 31 and the shower plate 32. A first space 34a is formed between an upper wall 31a of the main body 31 and the intermediate plate 33, and a second space 34b is formed between the intermediate plate 33 and the shower plate 32.

A first gas supply pipe 61 of the gas supply mechanism 13 is inserted into the first space 34a. A plurality of gas passages 35 connected to the first space 34a extends from the intermediate plate 33 to an upper surface of the shower plate 32 via a spacer 36 provided in the second space 34b. These gas passages 35 are connected to a plurality of first gas discharge holes 37 formed in the shower plate 32. On the other hand, a third gas supply pipe 63 of the gas supply mechanism is inserted into the second space 34b. A plurality of second gas discharge holes 38 formed in the shower plate 32 is connected to the second space 34b.

Further, a gas supplied from the first gas supply pipe 61 to the first space 34a is discharged into the chamber 10 via the gas passages 35 and the first gas discharge holes 37. Further, a gas supplied from the third gas supply pipe 63 to the second space 34b is discharged from the second gas discharge holes 38. That is, the gas supplied from the first gas supply pipe 61 and the gas supplied from the third gas supply pipe 63 are mixed with each other after being discharged from the shower head 26 to be of a post-mix type.

Further, the gas supplied from the first gas supply pipe 61 and the gas supplied from the third gas supply pipe 63 are mixed with each other inside the shower head to be of a pre-mix type.

A loading/unloading port 41 for loading/unloading the substrate W therethrough is provided in the sidewall portion 21a of the chamber main body 21. The loading/unloading port 41 may be opened/closed by a gate valve 42 so that the substrate W may be transferred between the loading/unloading port 41 and another module adjacent thereto.

The stage 12 has a substantially circular shape in a plan view and is fixed to the bottom portion 21b of the chamber 10. A temperature adjuster 45 for adjusting a temperature of the stage 12 is provided inside the stage 12. The temperature adjuster 45 may be constituted with, for example, a temperature-adjusting-medium flow path through which a temperature adjusting medium (such as water) for adjusting a temperature circulates, and a resistance heater. The temperature of the stage 12 is adjusted to a desired temperature by the temperature adjuster 45. As a result, the temperature of the substrate W placed on the stage 12 is controlled.

The gas supply mechanism 13 includes a HF gas source 51, an Ar gas source 52, an $NH_3$ gas source 53, and a $N_2$ gas source 54.

The HF gas source 51 supplies a HF gas, and the $NH_3$ gas source 53 supplies an $NH_3$ gas. The Ar gas source 52 and the $N_2$ gas source 54 supply a $N_2$ gas and an Ar gas, which are an inert gas that also functions as a dilution gas, a purge gas, or a carrier gas, respectively. Alternatively, both the Ar gas source 52 and the $N_2$ gas source 54 may supply the $N_2$ gas or the Ar gas. The inert gas is not limited to the Ar gas and the $N_2$ gas, and other noble gases such as a He gas may be used as the inert gas.

One ends of the first to fourth gas supply pipes 61 to 64 are connected to these gas sources 51 to 54, respectively. The other end of the first gas supply pipe 61 connected to the HF gas source 51 is inserted into the first space 34a of the shower head 26, as described above. The other end of the second gas supply pipe 62 connected to the Ar gas source 52 is connected to the first gas supply pipe 61. The other end of the third gas supply pipe 63 connected to the $NH_3$ gas source 53 is inserted into the second space 34b of the shower head 26, as described above. The other end of the fourth gas supply pipe 64 connected to the $N_2$ gas source 54 is connected to the third gas supply pipe 63.

Together with the Ar gas and the $N_2$ gas, which are inert gases, the HF gas and the $NH_3$ gas reach the first space 34a and the second space 34b of the shower head 26 and are discharged into the chamber 10 from the first gas discharge holes 37 and the second gas discharge holes 38, respectively.

Each of the first to fourth gas supply pipes 61 to 64 is provided with a flow rate controller 65 for opening/closing a flow path and controlling a flow rate. The flow rate controller 65 is constituted with, for example, an opening/closing valve and a flow rate controller such as a mass flow controller (MFC) or a flow control system (FCS).

The exhaust mechanism 14 includes an exhaust pipe 72 connected to an exhaust port 71 formed in the bottom portion 21b of the chamber 10. The exhaust mechanism 14 further includes an automatic pressure control valve (APC) 73 for controlling the internal pressure of the chamber 10 and a vacuum pump 74 for exhausting the interior of the chamber 10, which are provided in the exhaust pipe 72.

Two capacitance manometers 76a and 76b for high pressure and low pressure are provided on a sidewall of the chamber 10 to control the internal pressure of the chamber 10. A temperature sensor (not shown) for detecting the temperature of the substrate W is provided in the vicinity of the substrate W placed on the stage 12.

The chamber 10, the shower head 26, and the stage 12, which constitute the etching apparatus 1, are made of a metal material such as aluminum. A film such as an oxide film may be formed on the surfaces of the chamber 10, the shower head 26, and the stage 12.

The etching apparatus 1 further includes a controller 80. The controller 80 is constituted with a computer and includes a main controller equipped with a CPU, an input device, an output device, a display device, and a storage device (storage medium). The main controller controls an operation of each component of the etching apparatus 1. The control of each component by the main controller is performed based on a control program stored in a storage medium (hard disk, optical disc, semiconductor memory, or the like) incorporated in the storage device. A process recipe is stored as the control program in the storage medium, and processing of the etching apparatus 1 is executed based on the process recipe.

<Etching Method>

Next, an etching method according to an embodiment, which is performed in the etching apparatus 1 configured as described above, will be described. The etching method described below is performed under the control of the controller 80.

FIG. 2 is a flowchart for explaining the etching method according to an embodiment. First, a substrate W having a three-layered film obtained by stacking a first silicon oxide-based film, a silicon nitride-based film, and a second silicon oxide-based film in that order is provided inside the chamber 10 (step ST1).

Next, inside the chamber 10, using a HF—$NH_3$-based gas, the three-layered film is collectively etched while adjusting a gas ratio for each of the first silicon oxide-based film, the silicon nitride-based film, and the second silicon oxide-based film (step ST2).

At this time, the first silicon oxide-based film, the silicon nitride-based film, and the second silicon oxide-based film are etched with control of the gas ratio so that each film is etched appropriately with a good selectivity in order to minimize loading. The etching of each film is performed with appropriate control of the temperature of the stage 12 and the internal pressure of the chamber 10.

When etching the silicon oxide-based films and the silicon nitride-based film with the HF—$NH_3$-based gas, ammonium fluorosilicate (AFS) is generated as a reaction product. Therefore, in order to collectively etch the films constituting the three-layered film inside the chamber 10, it is preferable to use cycle etching in which an operation of supplying the HF—NH$_3$-based gas and an operation of purging the interior of the chamber 10 are repeatedly performed in the etching of each film. As a result, the generation of AFS when the HF—NH$_3$-based gas is supplied and the sublimation of AFS by the purging are repeatedly performed to proceed with the etching. The number of repetitions is appropriately set according to the film thickness of each film.

More specific description will be given below. In step ST1, the structure and stack direction of the substrate W are not limited as long as the substrate W has a three-layered film.

An example of the structure may include, for example, one schematically shown in FIG. 3. In the example of FIG. 3, the substrate W includes a Si film 101 formed on a base material (not shown), and an ONO stacked film 102, which is a three-layered film to be etched, formed on the Si film 101. The ONO stacked film 102 is composed by stacking a second silicon oxide-based film 113, a silicon nitride-based film 112, and a first silicon oxide-based film 111 in this order from the bottom. A film thickness of each of the first silicon oxide-based film 111, the silicon nitride-based film 112, and the second silicon oxide-based film 113 may be in a range of 6 to 12 nm. A Si film 103 and a SiN film 104 are formed on the ONO stacked film 102, and a recess (trench or hole) 105 is formed in the Si film 103 and the SiN film 104. The Si films 101 and 103 may be poly-Si films or amorphous Si films (a-Si films).

By collectively etching the first silicon oxide-based film 111, the silicon nitride-based film 112, and the second silicon oxide-based film 113 with respect to the substrate W of FIG. 3 in step ST2, the Si film 101 as an underlying film is exposed, as shown in FIG. 4.

The first silicon oxide-based film 111 and the second silicon oxide-based film 113 are mainly composed of Si and O and may contain additives. Although the first silicon oxide-based film 111 and the second silicon oxide-based film 113 may be made of the same material, they may be made of different materials. Examples of the first silicon oxide-based film may include a thermal oxide film (Th—SiO$_2$ film) and a TEOS film (CVD-SiO$_2$ film). The TEOS film may be a film formed by a CVD method using tetraethoxysilane (TEOS) as a Si precursor. The TEOS film may be a PTEOS film formed by plasma CVD. Examples of the second silicon oxide-based film 113 may include a SiO$_2$ film formed by ALD (ALD-SiO$_2$ film) and a SiON film. These films have a lower density than that of the thermal oxide film or TEOS film used as the first silicon oxide-based film 111. By making the second silicon oxide-based film 113 lower in density than the second silicon oxide-based film 113 in this way, the second silicon oxide-based film 113 may be selectively etched with respect to the first silicon oxide-based film 111.

The silicon nitride-based film 112 is mainly composed of Si and N and may contain additives. Examples of the silicon nitride-based film 112 may include SiN films (CVD-SiN film and ALD-SiN film) formed by the CVD method or the ALD method.

Figure 5:
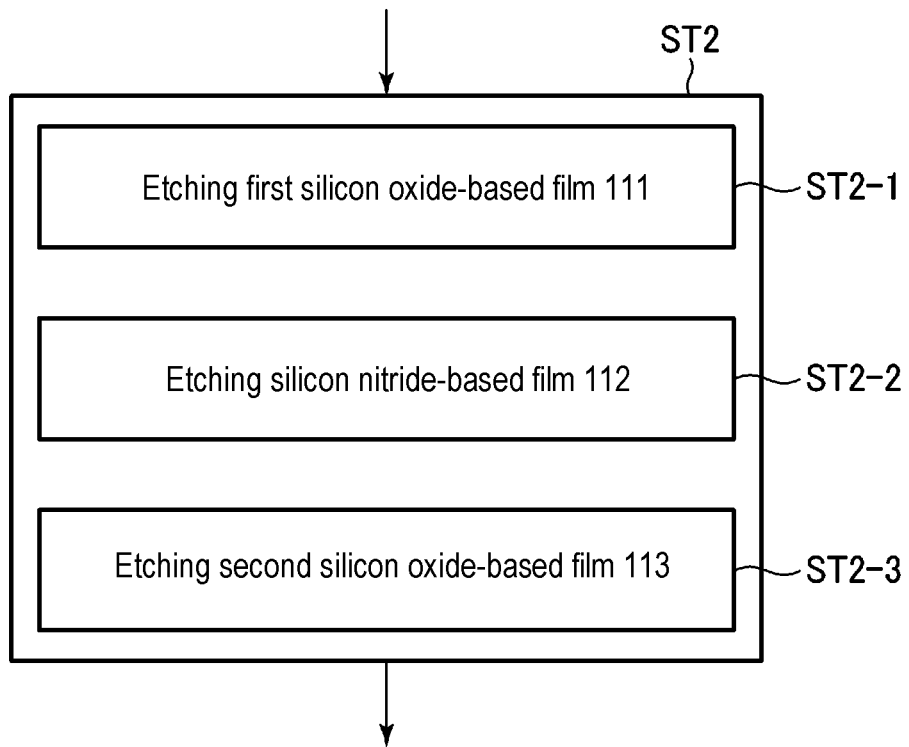
FIG. 5 is a diagram showing in detail an etching process of step ST2 in the etching method according to the embodiment.

As shown in FIG. 5, step ST2 includes step ST2-1 of etching the first silicon oxide-based film 111, step ST2-2 of etching the silicon nitride-based film 112, and step ST2-3 of etching the second silicon oxide-based film 113. In order to perform desired etching in these steps, the gas ratio of the HF—NH$_3$-based gas is adjusted in steps ST2-1 and ST2-3 of etching the silicon oxide-based films and step ST2-2 of etching the silicon nitride-based film.

Figure 6:
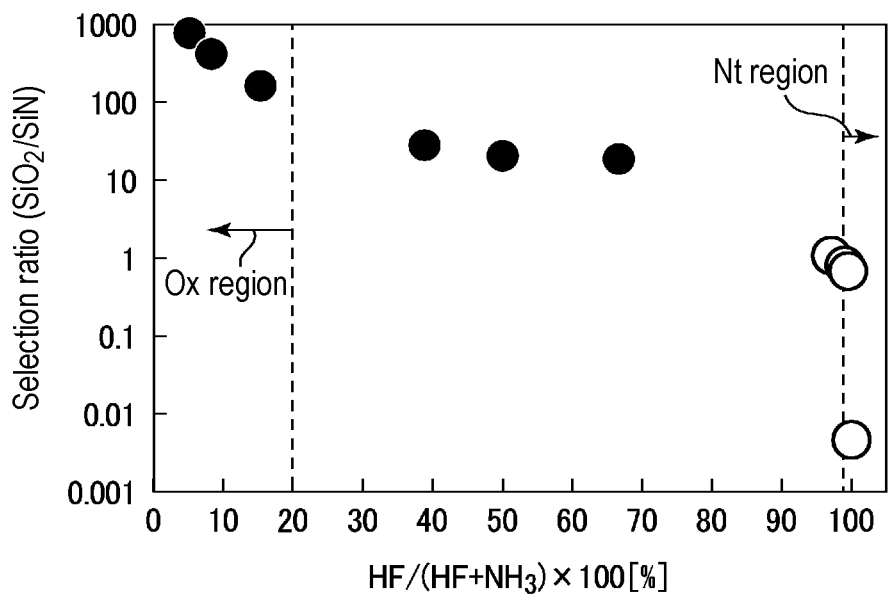
FIG. 6 is a diagram showing a relationship between HF/(HF+$NH_3$) and a selectivity of $SiO_2$ to SiN when a $SiO_2$ film and a SiN film are etched with a change in ratio of a $NH_3$ gas and a HF gas.

FIG. 6 is a diagram showing a relationship between a ratio of a HF gas to a HF gas and NH$_3$ gas (HF gas ratio; HF/(HF+NH$_3$)×100(%)) and the selectivity of SiO$_2$ to SiN (SiO$_2$/SiN) when the SiO$_2$ film (Th—SiO$_2$ film) and the SiN film are etched by changing the ratio of the NH$_3$ gas and the HF gas. As shown in FIG. 6, it can be seen that the SiO$_2$ film is easily etched in a range where the NH$_3$ gas is rich, and a high selectivity of 100 or more with respect to the silicon nitride film is obtained in a range where the ratio of the HF gas is 20% or less. However, if the ratio of the HF gas is less than 3%, a reaction will be difficult to proceed. On the other hand, it can be seen that the SiN film is easily etched in a range where the HF gas is rich, and a high selectivity is obtained in a range where the ratio of the HF gas is about 99% or more. Specifically, it can be seen that SiO$_2$/SiN is 0.01 or less, that is, the selectivity of SiN to SiO$_2$ is 100 or more, in a range where the ratio of the HF gas is 100%.

Accordingly, it is preferable that the ratio of the HF gas is 3 to 20% in steps ST2-1 and ST2-3 of etching the silicon oxide-based films. More specifically, the ratio of the HF gas is in a range of 3 to 9%. Within this range, a sufficient etching amount may be obtained in addition to the selectivity.

On the other hand, in step ST2-2 of etching the silicon nitride-based film, the ratio of the HF gas may be 99% or more. More specifically, the ratio of the HF gas may be 100%.

In the etching of step ST2, when performing step ST2-3 of etching the second silicon oxide-based film 113, it is preferable to selectively etch the first silicon oxide-based film 111. When the first silicon oxide-based film 111 is a Th—SiO$_2$ film or a CVD-SiO$_2$ film and the second silicon oxide-based film 113 is an ALD-SiO$_2$ film or a SiON film, the second silicon oxide-based film 113 may be selectively etched in the following manner. That is, by reducing the ratio of HF gas when etching the second silicon oxide-based film 113 more than that when etching the first silicon oxide-based film 111, the second silicon oxide-based film 113 may be selectively etched with respect to the first silicon oxide-based film 111.

The following ranges may be set for gas flow rates when each film is etched with the specific gas ratio as described above.

In step ST2-1 of etching the first silicon oxide-based film 111
  HF gas: 50 to 100 sccm
  NH$_3$ gas: 450 to 550 sccm
  N$_2$ gas+Ar gas: 300 to 600 sccm
In step ST2-2 of etching the silicon nitride-based film 112
  HF gas: 800 to 1,000 sccm
  NH$_3$ gas: 0 to 10 sccm
  N$_2$ gas+Ar gas: 300 to 600 sccm
In step ST2-3 of etching the second silicon oxide-based film 113
  HF gas: 30 to 50 sccm (less than when etching the first silicon oxide-based film)
  NH$_3$ gas: 450 to 550 sccm
  N$_2$ gas+Ar gas: 300 to 600 sccm Regarding a pressure in step ST2, it is preferable to set the pressure to be lower in steps ST2-1 and ST2-3 of etching the first and second silicon oxide-based films 111 and 113 than in the step of etching the silicon nitride-based film 112. As a result, the first and second silicon oxide-based films 111 and 113 may be selectively etched with respect to the silicon nitride-based film 112. On the other hand, it is preferable to set the pressure to be higher in step ST2-2 of etching the silicon nitride-based film 112 than in the steps of etching the first and second silicon oxide-based films 111 and 113. As a result, the silicon nitride-based film 112 may be selectively etched with respect to the first and second silicon oxide-based films 111 and 113.

More specifically, the pressure is 5 Torr (667 Pa) or less in steps ST2-1 and ST2-3 of etching the first and second silicon oxide-based films 111 and 113, and is 5 to 100 Torr (667 to 13,332 Pa) in step ST2-2 of etching the silicon nitride-based film 112.

The substrate temperature (stage temperature) in step ST2-2 of etching the silicon nitride-based film 112 may be 80 to 100 degrees C., more specifically 90 to 100 degrees C. By setting the temperature within this range, the silicon nitride-based film 112 may be etched with a realistic etching amount and with a high selectivity with respect to the first and second silicon oxide-based films 111 and 113.

Figure 7:
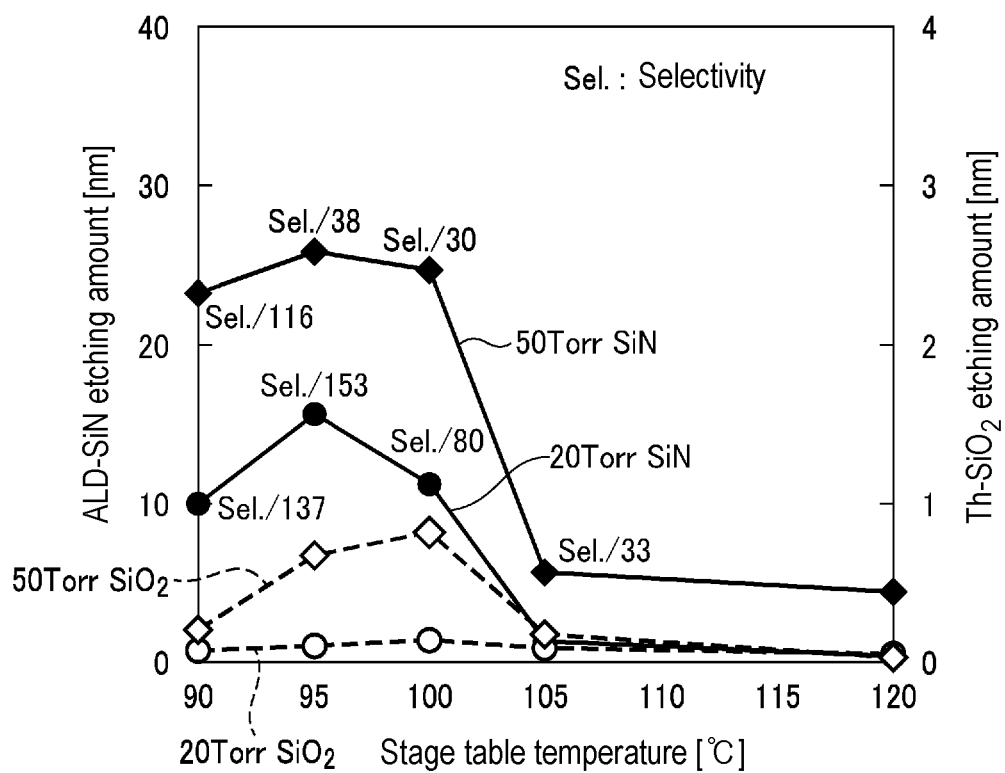
FIG. 7 is a diagram showing a relationship between a stage temperature and an etching amount of each film, and a selectivity of an ALD-SiN film to a Th—$SiO_2$ film when the ALD-SiN film and the Th—$SiO_2$ film are etched with a change in temperature of a stage from 90 to 120 degrees C.

FIG. 7 is a diagram showing a relationship between a stage temperature and an etching amount of each film, and the selectivity of an ALD-SiN film to a Th—$SiO_2$ film when the ALD-SiN film and the Th—$SiO_2$ film are etched with 100% HF gas at pressures of 20 Torr and 50 Torr while changing the stage temperature from 90 to 120 degrees C. As shown in FIG. 7, at 90 to 100 degrees C., the SiN film may be etched with a realistic etching amount and with a high selectivity with respect to the $SiO_2$ film. At 105 degrees C., although the selectivity is high, the etching amount may become small.

Figure 8:
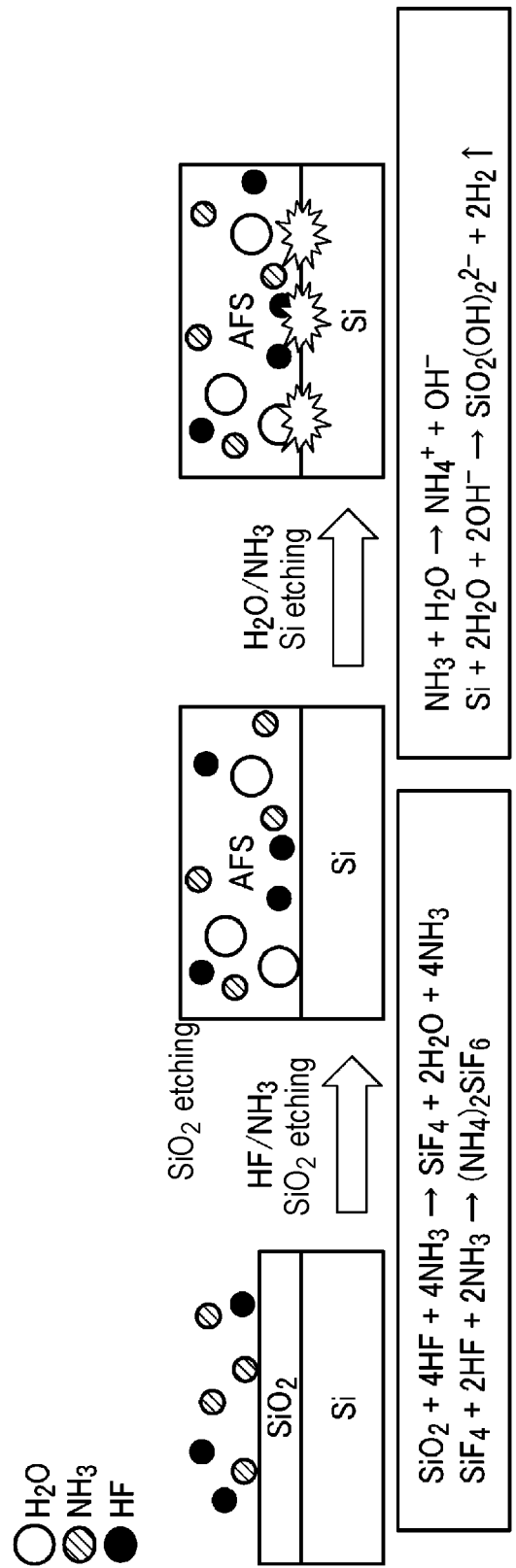
FIG. 8 is a view showing a mechanism for etching Si when etching the ONO stacked film.
Figure 9:
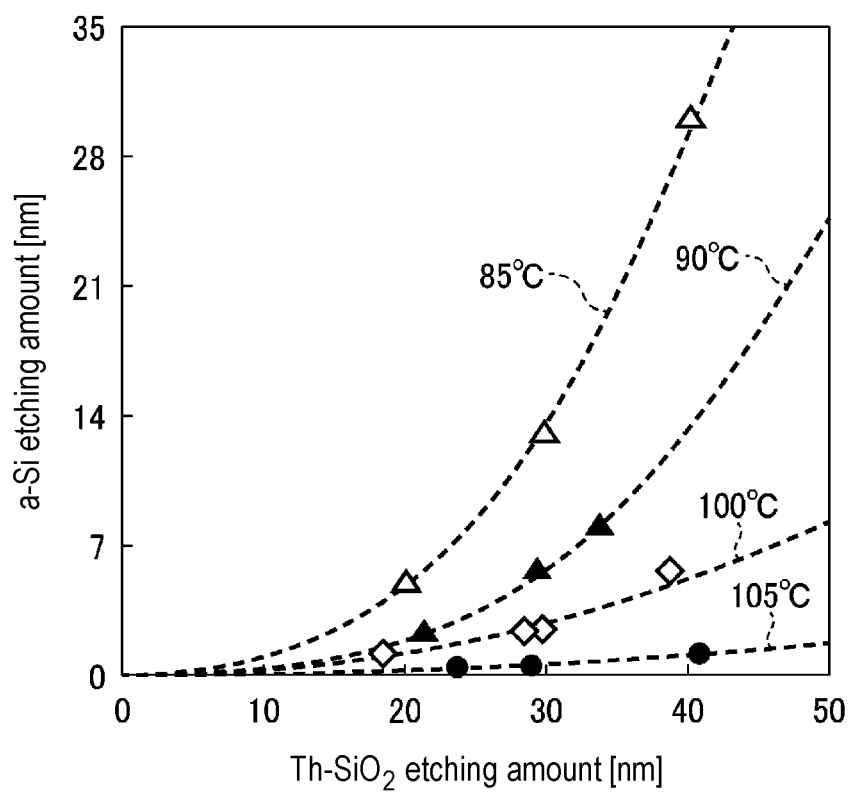
FIG. 9 is a diagram showing a relationship between an etching amount of the Th—$SiO_2$ film and an etching amount of an a-Si film when the Th—$SiO_2$ film is etched with the HF gas and the $NH_3$ gas at each temperature.

Further, in the substrate W having the structure shown in FIG. 3, a high selectivity with respect to the Si films 101 and 103 is required in the etching of each film of the ONO stacked film 102, but when the temperature is low, Si may be etched. The model thereof is as follows. FIG. 8 is a view showing a model in which Si is etched when the ONO stacked film is etched. For example, when the first and second silicon oxide-based films 111 and 113 are etched, as shown in FIG. 8, etching is performed with a HF gas and an $NH_3$ gas, and $H_2O$ is generated in the process of generating AFS. When the temperature is low, $H_2O$ remains and reacts with $NH_3$, which is an introduced gas, thereby causing Si to be alkali-etched. In order to suppress such a reaction, it is preferable to remove $H_2O$ by increasing the substrate temperature. FIG. 9 is a diagram showing a relationship between the etching amount of the Th—$SiO_2$ film and the etching amount of the a-Si film when the Th—$SiO_2$ film is etched with the HF gas and the $NH_3$ gas at each temperature. As shown in FIG. 9, the selectivity of the Th—$SiO_2$ film to the a-Si film tends to be low at 85 degrees C., but a somewhat high selectivity is obtained at 90 degrees C., so that the etching amount of a-Si is reduced as the temperature increases. Accordingly, in order to selectively etch each film with respect to Si in step ST2, the stage temperature (substrate temperature) may be set to 90 degrees C. or higher. As described above, since the etching amount of the SiN film is small at 105 degrees C., the stage temperature may be 90 to 100 degrees C.

Considering the result of the selectivity of the SiN film to the $SiO_2$ film and the selectivity of the $SiO_2$ film to the Si film, the substrate temperature (stage temperature) during the etching of the ONO stacked film 102 in step ST2 may be 80 to 100 degrees C., more specifically 90 to 100 degrees C. Although the temperature may be changed in steps ST2-1 to ST2-3 of etching each film within this range, it is preferable to keep the temperature substantially the same.

In steps ST2-1 to ST2-3 of etching each film in step ST2, as described above, the cycle etching in which the operation of supplying the HF—$NH_3$-based gas to generate a reaction product and the operation of purging the interior of the chamber 10 to sublimate the reaction product are repeatedly performed may be performed. Further, after the etching of the ONO stacked film 102 is completed, it is preferable that the substrate W is unloaded from the chamber 10 and is subjected to heat treatment for residue removal by a heating device.

An operation time at which the HF—$NH_3$-based gas is supplied once during the cycle etching of each film may be in a range of 20 to 60 seconds. Further, an operation time at which the purging operation is performed once may be 3 minutes or longer, more specifically in a range of 3 to 5 minutes, from the viewpoint of sufficiently removing AFS. However, when the heat treatment for residue removal is performed after completing the etching of the ONO stacked film 102, the purge time in the final step ST2-3 of etching the second silicon oxide-based film 113 may be short, specifically in a range of 30 to 60 seconds.

Further, the purging operation may be performed by merely evacuating the interior of the chamber 10, or by supplying a purge gas in parallel with the evacuation. The Ar gas and/or the $N_2$ gas supplied from the Ar gas source 52 and/or the $N_2$ gas source 54 may be used as the purge gas. In order to effectively discharge AFS, it is preferable to perform the evacuation alone.

During the purging operation, the temperature of the stage 12 is set so that the sublimation of AFS generated on the substrate W may proceed. When the temperature of the stage 12 is within the above-described temperature range of 80 to 100 degrees C., it is possible to sufficiently remove AFS, which is a reaction product, by the purging operation in the cycle etching.

In the substrate W having the structure shown in FIG. 3, the selectivity to the SiN film 104 is also required when the ONO stacked film 102 is etched. Although the SiN film 104 is a film of the same kind as the silicon nitride-based film 112 of the ONO stacked film 102, a loss of the SiN film 104 may be reduced by lengthening the purge time during the cycle etching of the silicon nitride-based film 112 to reduce AFS and $H_2O$ as much as possible. As a result, the selectivity to the SiN film 104 may be ensured when the silicon nitride-based film 112 is etched. The purge time at this time may be in a range of 3 to 5 minutes.

After the etching of each film is completed, the interior of the chamber 10 is purged. The Ar gas and/or the $N_2$ gas supplied from the Ar gas source 52 and/or the $N_2$ gas source 54 may be used as the purge gas. After completing the etching of the second silicon oxide-based film 113, the chamber is purged as described above. Thereafter, the substrate W is unloaded from the chamber 10.

As disclosed with reference to the above-mentioned Patent Document 1, the method of etching the $SiO_2$ film with the HF gas and the $NH_3$ gas has been previously known. On the other hand, in the structure of a semiconductor device, an ONO stacked film, which is the object of the present embodiment, is frequently used, and etching of the ONO stacked film is required. When etching the ONO stacked film, it is necessary to etch the $SiO_2$ film and the SiN film with high selectivity in order to minimize the loading. For the reason, in the related art, the gas etching of the $SiO_2$ film with wet etching of the SiN film has been used in combination.

In contrast, in the present embodiment, by optimizing the conditions such as the gas ratio of the first silicon oxide-based film, the silicon nitride-based film, and the second silicon oxide-based film constituting the ONO stacked film and applying the cycle etching, it is possible to etch the ONO stacked film by collective etching using the gas etching. As a result, the ONO stacked film may be etched with a higher throughput using a simpler process than that in the related art.

Further, when a Si film exists at a position adjacent to the ONO stacked film, it is required to etch the ONO stacked film at a high selectivity with respect to the Si film. In particular, as shown in FIG. 3, the Si film 101 underlying the ONO stacked film 102 is often used as a functional portion (such as a channel) of a transistor, and therefore it is required that the ONO stacked film 102 is etched as little as possible when the ONO stacked film 102 is etched. In contrast, in the present embodiment, as described above, the ONO stacked film may be etched with a high selectivity even with respect to the Si film.

Other Applications

Although the embodiments have been described above, the embodiments disclosed this time should be considered as illustrative and not restrictive in all respects. The above embodiments may be omitted, substituted, or modified in various ways without departing from the scope and spirit of the appended claims.

For example, the apparatuses of the above embodiments are merely examples, and apparatuses with various configurations may be applied. Further, although a semiconductor wafer is illustrated as the substrate, other substrates such as an FPD (Flat Panel Display) substrate and a ceramics substrate may be used.

EXPLANATION OF REFERENCE NUMERALS

1: etching apparatus, 10: chamber, 12: stage, 13: gas supply mechanism, 14: exhaust mechanism, 26: shower head, 45: temperature adjuster, 51: HF gas source, 53: $NH_3$ gas source, 80: controller, 101,103: Si film, 102: ONO stacked film, 104: SiN film, 105: recess, 111: first silicon oxide-based film, 112: silicon nitride-based film, 113: second silicon oxide-based film, W: substrate

What is claimed is:

1. An etching method, comprising:
   providing, to an interior of a chamber, a substrate having a three-layered film formed by stacking a first silicon oxide-based film, a silicon nitride-based film, and a second silicon oxide-based film; and
   collectively etching the three-layered film using a HF—$NH_3$-based gas in the interior of the chamber while adjusting a gas ratio in each of the first silicon oxide-based film, the silicon nitride-based film, and the second silicon oxide-based film.

2. The etching method of claim 1, wherein the etching of each of the first silicon oxide-based film, the silicon nitride-based film, and the second silicon oxide-based film is performed by a cycle etching in which an operation of supplying the HF—$NH_3$-based gas to generate a reaction product and a purging operation of purging the interior of the chamber to sublimate the reaction product are repeatedly performed.

3. The etching method of claim 2, wherein a time of the purging operation when etching the first silicon oxide-based film, the silicon nitride-based film, and the second silicon oxide-based film is set to 3 to 5 minutes.

4. The etching method of claim 2, further comprising: after the etching of the three-layered film, unloading the substrate from the chamber, and removing residues by heating the unloaded substrate,
   wherein a time of the purging operation with respect to the first silicon oxide-based film and the silicon nitride-based film is set to 3 to 5 minutes, and a time of the purging operation with respect to the second silicon oxide-based film is set to 30 to 60 seconds.

5. The etching method of claim 2, wherein the substrate has a SiN film in a portion other than the three-layered film, and a time of the purging operation is set to 3 to 5 minutes when etching the silicon nitride-based film.

6. The etching method of claim 1, wherein, when etching the first silicon oxide-based film and the second silicon oxide-based film, as the HF—$NH_3$-based gas, a HF gas and an $NH_3$ gas are supplied with a gas ratio of HF/(HF+$NH_3$) of 3 to 20%, and when etching the silicon nitride-based film, as the HF—$NH_3$-based gas, the HF gas and the $NH_3$ gas are supplied with a gas ratio of HF/(HF+$NH_3$) of 99% or more.

7. The etching method of claim 1, wherein, when etching the first silicon oxide-based film and the second silicon oxide-based film, an internal pressure of the chamber is set to 667 Pa or less, and when etching the silicon nitride-based film, the internal pressure of the chamber is set to be in a range of 667 to 13,332 Pa.

8. The etching method of claim 1, wherein a temperature of the substrate when etching the silicon nitride-based film is 80 to 100 degrees C.

9. The etching method of claim 8, wherein the temperature of the substrate when etching the three-layered film is 80 to 100 degrees C.

10. The etching method of claim 9, wherein the substrate has Si adjacent to the three-layered film, and the temperature of the substrate when etching the three-layered film is in a range of 90 to 100 degrees C.

11. The etching method of claim 1, wherein the etching of the three-layered film starts from the first silicon oxide-based film and ends in the second silicon oxide-based film, and
    wherein the first silicon oxide-based film is a thermal oxide film or a TEOS film, and the second silicon oxide-based film is a silicon oxide film formed by ALD or a SiON film.

12. The etching method of claim 11, wherein a flow rate of a HF gas when etching the second silicon oxide-based film is set to be smaller than that when etching the first silicon oxide-based film.

13. The etching method of claim 3, wherein, when etching the first silicon oxide-based film and the second silicon oxide-based film, as the HF—$NH_3$-based gas, a HF gas and an $NH_3$ gas are supplied with a gas ratio of HF/(HF+$NH_3$) of 3 to 20%, and when etching the silicon nitride-based film, as the HF—$NH_3$-based gas, the HF gas and the $NH_3$ gas are supplied with a gas ratio of HF/(HF+$NH_3$) of 99% or more.

14. The etching method of claim 13, wherein, when etching the first silicon oxide-based film and the second silicon oxide-based film, an internal pressure of the chamber is set to 667 Pa or less, and when etching the silicon nitride-based film, the internal pressure of the chamber is set to be in a range of 667 to 13,332 Pa.

15. An etching apparatus comprising:
    a chamber in which a substrate having a three-layered film formed by stacking a first silicon oxide-based film, a silicon nitride-based film, and a second silicon oxide-based film is accommodated;
    a stage provided in an interior of the chamber and on which the substrate is placed;
    a gas supplier configured to supply a basic gas and a fluorine-containing gas to the interior of the chamber;

an exhauster configured to exhaust the interior of the chamber;
a temperature adjuster configured to adjust a temperature of the substrate on the stage; and
a controller,
wherein the controller controls the gas supplier, the exhauster, and the temperature adjuster so as to collectively etch the three-layered film using a HF—NH$_3$-based gas for the substrate placed on the stage inside the chamber while adjusting a gas ratio in each of the first silicon oxide-based film, the silicon nitride-based film, and the second silicon oxide-based film.

16. The etching apparatus of claim 15, wherein the controller performs a control so as to perform the etching of each of the first silicon oxide-based film, the silicon nitride-based film, and the second silicon oxide-based film by repeatedly performing an operation of supplying the HF—NH$_3$-based gas to generate a reaction product and an operation of purging the interior of the chamber to sublimate the reaction product.

17. The etching apparatus of claim 15, wherein the controller causes a HF gas and an NH$_3$ gas to be supplied as the HF—NH$_3$-based gas with a gas ratio of HF/(HF+NH$_3$) of 3 to 20% when etching the first silicon oxide-based film and the second silicon oxide-based film, and causes the HF gas and the NH$_3$ gas to be supplied as the HF—NH$_3$-based gas with a gas ratio of HF/(HF+NH$_3$) of 99% or more when etching the silicon nitride-based film.

18. The etching apparatus of claim 15, wherein the controller controls an internal pressure of the chamber to be set to 667 Pa or less when etching the first silicon oxide-based film and the second silicon oxide-based film, and controls the internal pressure of the chamber to be set to be in a range of 667 to 13,332 Pa when etching the silicon nitride-based film.

19. The etching apparatus of claim 15, wherein the controller controls the temperature of the substrate when etching the three-layered film to be 80 to 100 degrees C.

20. The etching apparatus of claim 15, wherein the etching of the three-layered film starts from the first silicon oxide-based film and ends in the second silicon oxide-based film, the first silicon oxide-based film is a thermal oxide film or a TEOS film, and the second silicon oxide-based film is a silicon oxide film formed by ALD or a SiON film, and
wherein the controller controls a flow rate of a HF gas when etching the second silicon oxide-based film to become smaller than that when etching the first silicon oxide-based film.

* * * * *